(12) United States Patent
Rudolph

(10) Patent No.: US 8,259,839 B2
(45) Date of Patent: Sep. 4, 2012

(54) METHOD FOR AVOIDING INTERFERENCE RADIATION OF AM TRANSMITTERS USED IN DIGITAL TRANSMISSION

(75) Inventor: Dietmar Rudolph, Berlin (DE)

(73) Assignee: Deutsche Telekom AG, Bonn (DE)

(*) Notice: Subject to any disclaimer, the term of this patent is extended or adjusted under 35 U.S.C. 154(b) by 788 days.

(21) Appl. No.: 11/937,724

(22) Filed: Nov. 9, 2007

(65) Prior Publication Data

US 2008/0063112 A1 Mar. 13, 2008

Related U.S. Application Data

(63) Continuation of application No. 10/344,428, filed as application No. PCT/DE02/01315 on Apr. 10, 2002, now Pat. No. 7,313,175.

(30) Foreign Application Priority Data

Jun. 27, 2001 (DE) .................................. 101 31 849

(51) Int. Cl.
*H04L 27/00* (2006.01)
(52) U.S. Cl. .................................. 375/295; 375/296
(58) Field of Classification Search .................. 375/295
See application file for complete search history.

(56) References Cited

U.S. PATENT DOCUMENTS

| | | | |
|---|---|---|---|
| 3,900,823 A | 8/1975 | Sokal et al. | |
| 4,044,241 A | 8/1977 | Hatley, Jr. | |
| 4,053,750 A * | 10/1977 | Constant | ...................... 708/315 |
| 4,878,030 A | 10/1989 | Vincze | |
| 4,941,199 A | 7/1990 | Saam | |
| 6,191,653 B1 * | 2/2001 | Camp et al. | ................... 330/129 |
| 6,275,685 B1 | 8/2001 | Wessel et al. | |
| 6,744,806 B1 * | 6/2004 | Moore et al. | .................. 375/130 |

FOREIGN PATENT DOCUMENTS

| | | |
|---|---|---|
| CN | 1290999 A | 4/2001 |
| DE | 4319217 A1 | 12/1994 |
| DE | 19717169 A1 | 10/1998 |
| DE | 19911437 A1 | 9/2000 |
| DE | 10012538 C1 | 9/2001 |
| DE | 69521033 T2 | 11/2001 |
| EP | 1011192 A2 | 6/2000 |
| EP | 1150422 A2 | 10/2001 |

OTHER PUBLICATIONS

Peter Senger, DRM—Digital radio mondiale—A global consortium for a new digital standard, Rundfunktech. Mitteilungen, 1999, vol. 1, pp. 29-35.

* cited by examiner

*Primary Examiner* — Shuwang Liu
*Assistant Examiner* — Michael Neff
(74) *Attorney, Agent, or Firm* — Leydig, Voit & Mayer, Ltd.

(57) ABSTRACT

A method for avoiding spurious emissions in an AM transmitter for digital transmission includes converting a digital modulation for controlling the AM transmitter into an amplitude signal for an amplitude branch, and a phase-modulated RF signal for a RF branch. Non-linear distortions in an amplitude response and a delay-time characteristic of an amplitude branch are compensated for using a pre-equalization with inverse shapes by measuring and storing the amplitude response and the delay-time characteristic of the RF branch. An inverse transfer function is determined using respective shapes of the measured amplitude response and delay-time characteristic by an inverse Fourier transform. An equalizing network is dimensioned for the determined inverse transfer function. The equalizing network is connected in series upstream of the RF branch. The amplitude and RF branches are combined downstream of the amplitude and RF branches.

15 Claims, 2 Drawing Sheets

METHOD FOR AVOIDING INTERFERENCE RADIATION OF AM TRANSMITTERS USED IN DIGITAL TRANSMISSION

CROSS-REFERENCE TO RELATED APPLICATIONS

This application is a continuation of U.S. patent application Ser. No. 10/344,428, filed Feb. 12, 2003, which is a U.S. National Stage Application under 35 U.S.C. §371 of PCT International Application No. PCT/DE02/01315, filed Apr. 10, 2002, which claims priority to German Patent Application No. 101 31 849.9, filed Jun. 27, 2001. Each of these applications is hereby incorporated by reference as if set forth in its entirety.

BACKGROUND

1. Field of Invention

The present invention relates generally to the field of broadcast transmitters which will be converted from analog amplitude modulation (AM) to digital modulation as digitalization moves forward, and particularly to a method for avoiding spurious emissions in AM transmitters for digital transmission.

In this context, the intention is for the hitherto usual transmitter types, non-linear AM transmitters featuring an RF input (radio frequency) and an audio input, to continue in use. The reasons for this are as follows:

AM transmitters internally operate in switched mode and therefore have efficiencies which are better by a factor of 3 than those of linear transmitters which are otherwise usually used for digital transmission, for example, in the case of DAB (Digital Audio Broadcasting) and DVB (Digital Video Broadcasting). This results in a saving of operating costs.

it is easier to convince broadcasters to convert from analog to digital if no great investments come up in the preliminary stages.

2. Description of the Related Art

The digitalization of AM broadcasting is seen as the only chance to preserve these frequency ranges and the technology used therein in the long term. For implementation purposes, the consortium "Digital Radio Mondiale" was founded, see "Rundfunktechnische Mitteilungen" [Broadcasting Newsletter], 43rd year, 1999, issue 1, pages 29-35.

The use of a non-linear AM transmitter for digital modulation requires a special operating mode of the transmitter. The modulated digital signal is generated by two partial signals (I and Q), which are orthogonal to each other. The I-signal ("in phase") is modulated onto a cosine oscillation having the frequency Ft (carrier frequency). The Q-signal ("quadrature") is modulated onto a sine oscillation having the same frequency Ft. The sum of both modulated oscillations produces the complex modulated data signal (cosine 0.180 degrees, sine 90–+90 degrees). The modulated I/Q-signal is shaped by filters in such a manner that it has exactly the prescribed curve shape with the desired bandwidth.

For non-linear operation, it is required for the modulated I/Q-signal to be converted in such a manner that the two signals amplitude signal (A-signal) and phase-modulated carrier signal (RF-P) result therefrom which are suitable for proper control of the AM transmitter. Then, at the output of the AM transmitter, the modulated I/Q-signal is generated again with higher power.

The modulated I/Q-signal corresponds to a Cartesian representation. The Cartesian representation is converted to a polar representation with amplitude and phase. In this manner, the amplitude signal (A-signal) is obtained to control the AM transmitter at the audio input. A phase-modulated radio frequency (RF-P signal) is generated from the initially resulting phase signal (P-signal). Advantageously, the RF-P signal can also be directly obtained without the intermediate step via the P-signal. In this manner, the signals are obtained that are required for controlling the AM transmitter:

amplitude signal (A-signal)
  phase-modulated RF signal (RF-P signal)

The A-signal is fed into the modulator input (audio input) of the AM transmitter, and the RF-P signal is used for HF-type control of the transmitter. In the transmitter output stage, the two signals A & RF-P are multiplicatively combined, forming the high frequency digital output signal.

Due to the required conditioning process, both the A-signal and the RF-P signal obtain far larger bandwidths than the one the digital signal originally had and is intended to have again at the output of the transmitter.

Older modulators are frequently not able to provide the increased bandwidths (3-5 times the bandwidth in the AM mode of the transmitter) because they were not designed for this. When using only the limited bandwidth that "older" transmitters have available in the modulator section, then this results in considerable out-of-band and spurious emissions. These have the property that they have only a very small gradient in the spectrum and therefore interfere with quite a number of adjacent channels.

Thus, the band limitation in the amplitude branch (A-branch) and also in the RF-branch results in spurious emissions whose shoulder distance in relation to the spectrum of the data channel does not or only very inadequately meet the requirements of the ITU.

SUMMARY

The object of the present invention is to eliminate the non-linear distortions arising because of the band limitation in the amplitude branch and also in the RF-branch of the AM transmitter so as to meet the ITU limits during the emission of the digital signal.

The different signal propagation times between the amplitude branch and the RF-branch have to be accurately adjusted to values smaller than 1 microsecond in the digital modulator. However, the adjustment works only if the propagation times both in the amplitude branch and in the RF-branch are constant over the frequency. However, coupled or associated with the decrease of the amplitude response with increasing frequency, the band limitation in both branches also causes a non-linearity of the phase that is, non-constant propagation times.

Since in the RF-branch, the bandwidth is determined by the frequency limits of the resonant circuits, in particular of the driver stage, it is possible, through suitable selection of the quality of the resonant circuits, to adjust such a large bandwidth that the then still resulting out-of-band and spurious emissions become negligible compared to those resulting from other influences.

An object of an embodiment of the present invention is to eliminate or reduce non-linear distortions arising because of the band limitation in the amplitude branch and also in the RF-branch of an AM transmitter so as to meet the ITU limits during the emission of a digital signal.

The present invention provides a method for avoiding spurious emissions in an AM transmitter for digital transmission. The method includes converting a digital modulation for controlling the AM transmitter into an amplitude signal for an amplitude branch, and a phase-modulated RF signal for a RF branch. Non-linear distortions in an amplitude response and a delay-time characteristic of an amplitude branch are compensated for using a pre-equalization with inverse shapes by measuring and storing the amplitude response and the delay-time characteristic of the RF branch. An inverse transfer function is determined using respective shapes of the measured amplitude response and delay-time characteristic by an inverse Fourier transform. An equalizing network is dimensioned for the determined inverse transfer function. The equalizing network is connected in series upstream of the RF branch. The amplitude and RF branches are combined downstream of the amplitude and RF branches.

For the amplitude branch, the intention is to remedy the band limitation and the resulting distortion of the amplitude response and the delay-time characteristic by applying a pre-equalization with an inverse transfer function to the amplitude signal to thereby achieve an optimum compensation of the non-constant amplitude response and delay-time characteristic.

DETAILED DESCRIPTION

Figure 1:
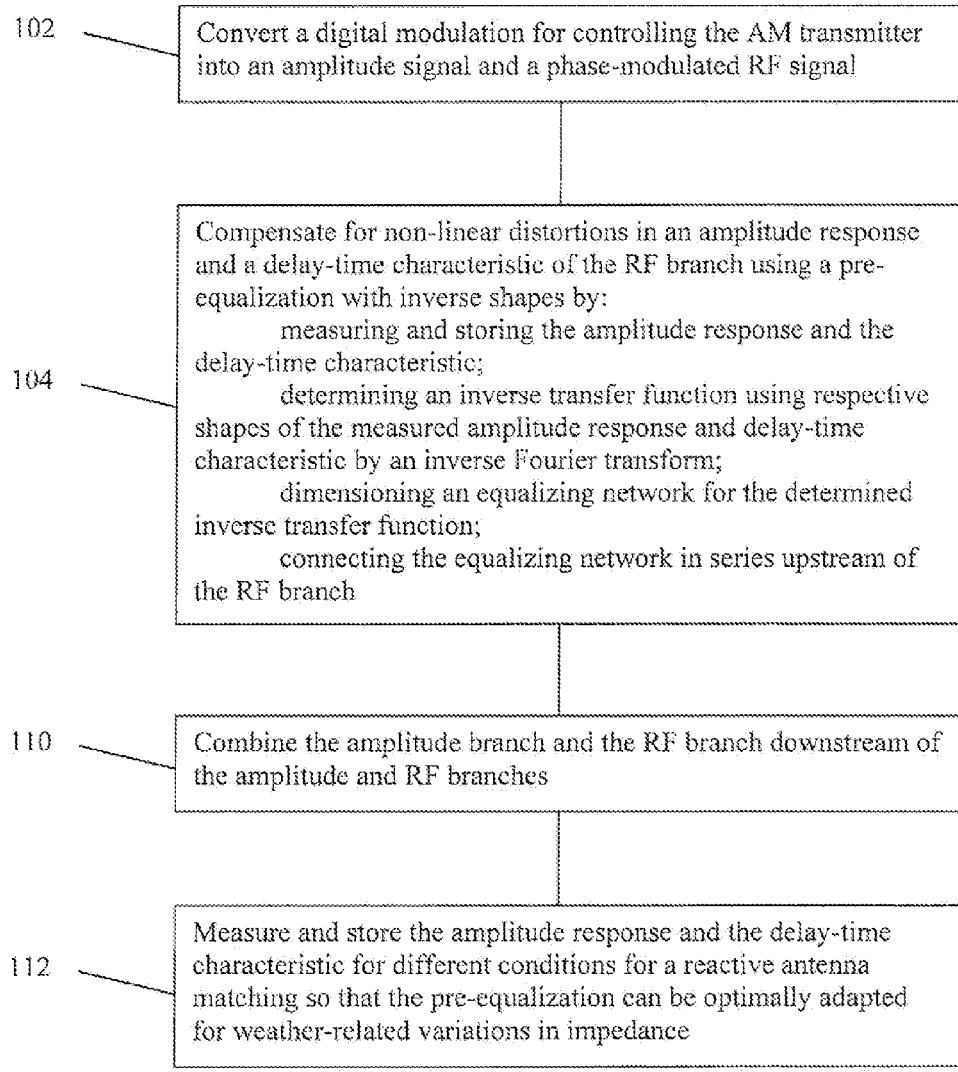
FIG. 1 shows a flow chart of a method for avoiding spurious emissions in AM transmitter for digital transmission according to a first embodiment.

Referring to FIG. 1, according to a method for avoiding spurious emissions in AM transmitter for digital transmission, a digital modulation for controlling the AM transmitter is converted into an amplitude signal and a phase-modulated RF signal (see block 102). Non-linear distortions in an amplitude response and a delay-time characteristic of an amplitude branch are compensated for using a pre-equalization with inverse shapes by: measuring and storing the amplitude response and the delay-time characteristic of an amplitude branch; determining an inverse transfer function using respective shapes of the measured amplitude response and delay-time characteristic by an inverse Fourier transform; dimensioning an equalizing network for the determined inverse transfer function; and connecting the equalizing network in series upstream of the amplitude branch (see block 104). The amplitude branch and the RF branch are combined downstream of the amplitude and RF branches (see block 110). The amplitude response and the delay-time characteristic for different conditions for a reactive antenna matching are measured and stored so that the pre-equalization can be optimally adapted for weather-related variations in impedance (see block 112).

Figure 2:
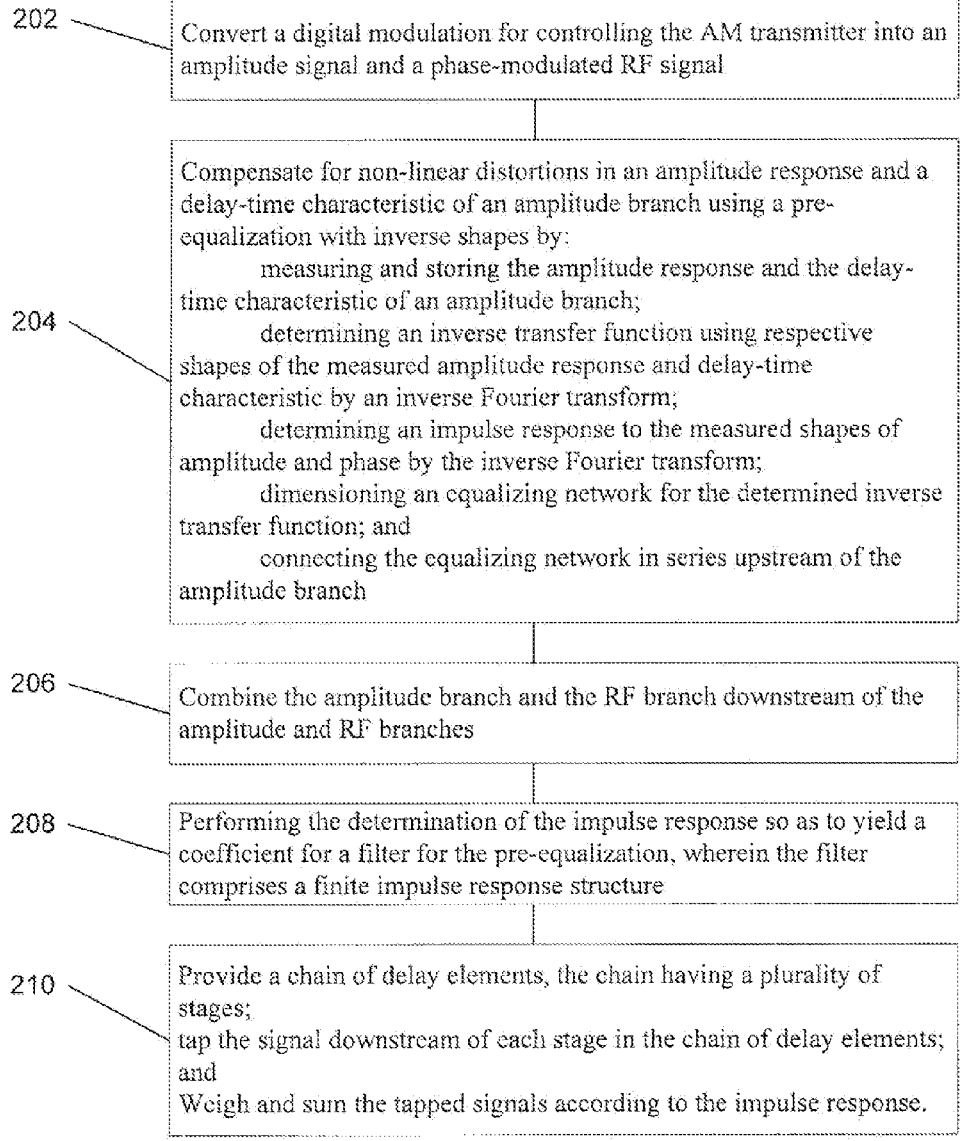
FIG. 2 shows a flow chart of a method for avoiding spurious emissions in AM transmitter for digital transmission according to a second embodiment.

Referring to FIG. 2, according to a method for avoiding spurious emissions in AM transmitter for digital transmission, a digital modulation for controlling the AM transmitter is converted into an amplitude signal and a phase-modulated RF signal (see block 202). Non-linear distortions in an amplitude response and a delay-time characteristic of an amplitude branch are compensated for using a pre-equalization with inverse shapes by: measuring and storing the amplitude response and the delay-time characteristic of an amplitude branch; determining an inverse transfer function using respective shapes of the measured amplitude response and delay-time characteristic by an inverse Fourier transform; determining an impulse response to the measured shapes of amplitude and phase by the inverse Fourier transform; dimensioning an equalizing network for the determined inverse transfer function; and connecting the equalizing network in series upstream of the amplitude branch (see block 204). The amplitude branch and the RF branch are combined downstream of the amplitude and RF branches (see block 206). A determination of the impulse response is performed so as to yield a coefficient for a filter for the pre-equalization, wherein the filter comprises a finite impulse response structure (see block 208). A chain of delay elements is provided, the chain having a plurality of stages; the signal downstream of each stage is tapped in the chain of delay elements; and the tapped signals according to the impulse response are weighted and summed (see block 210).

The inverse shape of the transfer function is limited to the frequency range from 0-20 KHz. This value is determined by the fact that in the A-branch a bandwidth of about 3-5 times the audio frequency bandwidth or about 3-5 times the bandwidth of the digital I/Q signal of 4.5 KHz (long wave and medium wave) or 5 KHz (short wave) is required and that, due to the limitation to this range, no instability can arise. In the case that transmission channels (two to four adjacent channels) are bundled at the transmitter end, the numerical values mentioned for the bandwidth are increased according to the bundling factor.

To apply this method, for the curve shapes of the amplitude response and the delay-time characteristic of the A-branch are determined with measuring techniques and available in stored form. Then, the mathematical values of the transfer function for the absolute value and the phase are determined by numerical interpolation, the shape of the phase being determined by integration over the measured shape of the propagation time. The impulse response to the measured shapes of amplitude and phase is determined by an inverse Fourier transform. In this manner, the impulse response yields the coefficients for the filter for the pre-equalization of the amplitude signal so that a compensation of the non-linearities in the A-branch is achieved.

The network used for the pre-equalization can be a filter having a FIR structure (finite impulse response) in which the signal can be tapped downstream of each of the stages of the chain of delay elements so that the tapped signals can be weighted and added up according to the desired impulse response.

The network with inverse shapes of amplitude, phase or propagation time is connected in series upstream of the amplitude branch of the transmitter.

Since the antenna matching of the transmitter acts back upon the amplitude response, the phase response and the delay-time characteristic of the A-branch, different shapes arise, depending on the matching conditions. Therefore, these shapes are measured for usual matching conditions and the results are stored. This makes it possible to select the appropriate shapes for the compensation, for example, in the case of weather-related variations in impedance of the antenna matching. The selection criterion for this can be provided by the measuring device for the antenna matching which is present in the transmitter anyway and which, possibly, needs to be modified and adapted for that purpose. In this manner, the compensation is ideally adapted to the practical transmitter operating conditions. Through corrections of the stored curve shapes, it is also very easily possible to control an optimum for the achieved shoulder distance.

The compensation of the non-constant amplitude response and delay-time characteristic by a pre-equalization with an inverse transfer function can also be used for the RF-branch.

As far as the amplitude branch and the RF-branch have constant propagation times, the propagation time difference between the two branches can be compensated for using the simple method of delaying the signal having the smaller propagation time.

What is claimed is:

1. A method for avoiding spurious emissions in an amplitude modulation (AM) transmitter for digital transmission, the method comprising:
   converting a digital modulation for controlling the AM transmitter into an amplitude signal for an amplitude branch and a phase-modulated radio frequency (RF) signal for an RF branch;
   compensating, at the AM transmitter, for non-linear distortions in an amplitude response and a delay-time characteristic of the RF branch using a pre-equalization with inverse shapes by:
      measuring and storing the amplitude response and the delay-time characteristic for different conditions for a reactive antenna matching so that the pre-equalization can be optimally adapted for weather related variations in impedance;
      determining an inverse transfer function using respective inverse shapes of the measured amplitude response and delay-time characteristic by an inverse Fourier transform;
      dimensioning, in an equalizing network, the determined inverse transfer function;
      connecting the equalizing network in a series connection, the series connection being upstream of the RF branch; and
   combining, at the AM transmitter, the amplitude branch and the RF branch downstream of the amplitude and RF branches.

2. A method for avoiding spurious emissions in an amplitude modulation (AM) transmitter for digital transmission, the method comprising:
   converting a digital modulation for controlling the AM transmitter into an amplitude signal for an amplitude branch and a phase-modulated radio frequency (RF) signal for an RF branch;
   compensating, at the AM transmitter, for non-linear distortions in an amplitude response and a delay-time characteristic of the RF branch using a pre-equalization with inverse shapes by:
      measuring and storing the amplitude response and the delay-time characteristic;
      determining an inverse transfer function using respective inverse shapes of the measured amplitude response and delay-time characteristic by an inverse Fourier transform;
      determining an impulse response to the measured shapes of amplitude and phase by the inverse Fourier transform;
      determining a value of the inverse transfer function by numerical interpolation;
      dimensioning, in an equalizing network, the determined inverse transfer function;
      connecting the equalizing network in a series connection, the series connection being upstream of the RF branch; and
   combining, at the AM transmitter, the amplitude branch and the RF branch downstream of the amplitude and RF branches.

3. The method as recited in claim 2, further comprising:
   determining the shape of the phase by integration over the measure shape of a propagation time.

4. The method as recited in claim 2, wherein the determining the impulse response is performed so as to yield a coefficient for a filter for the pre-equalization.

5. The method as recited in claim 4, wherein the filter comprises a finite impulse response structure.

6. The method as recited in claim 2, further comprising:
   providing a chain of delay elements, the chain having a plurality of stages;
   tapping the signal downstream of each stage in the chain of delay elements; and
   weighting and summing the tapped signals according to the impulse response.

7. A method for avoiding spurious emissions in an amplitude modulation (AM) transmitter for digital transmission, the method comprising:
   converting a digital modulation for controlling the AM transmitter into an amplitude signal for an amplitude branch and a phase-modulated radio frequency (RF) signal for an RF branch;
   compensating, at the AM transmitter, for non-linear distortions in an amplitude response and a delay-time characteristic of the RP branch using a pre-equalization with inverse shapes by:
      measuring and storing the amplitude response and the delay-time characteristic;
      determining an inverse transfer function using respective inverse shapes of the measured amplitude response and delay-time characteristic by an inverse Fourier transform, the inverse transfer function being limited to a frequency range of 3-5 times of a bandwidth of a digital I/Q signal;
      dimensioning, in an equalizing network, the determined inverse transfer function;
      connecting the equalizing network in series upstream of the RF branch; and
   combining, at the AM transmitter, the amplitude branch and the RF branch downstream of the amplitude and RF branches.

8. The method as recited in claim 7 further comprising:
   measuring and storing the amplitude response and the delay-time characteristic for different conditions for a reactive antenna matching so that the pre-equalization can be optimally adapted for weather-related variations in impedance.

9. The method as recited in claim 7 further comprising:
   determining an impulse response to measured shapes of amplitude and phase by the inverse Fourier transform.

10. The method as recited in claim 9, further comprising:
    determining a value of the inverse transfer function, by numerical interpolation.

11. The method as recited in claim 9, further comprising:
    determining the shape of the phase by integration over a measured shape of a propagation time.

12. The method as recited in claim 9, further comprising:
    providing a chain of delay elements, the chain having a plurality of stages;
    tapping the signal downstream of each stage in the chain of delay elements; and
    weighting and summing the tapped signals according to the impulse response.

13. The method as recited in claim 9, wherein the determining the impulse response is performed so as to yield a coefficient for a filter for the pre-equalization.

14. The method as recited in claim 13, wherein the filter comprises a finite impulse response structure.

15. A method for avoiding spurious emissions in an amplitude modulation (AM) transmitter for digital transmission, the method comprising:
  converting a digital modulation for controlling the AM transmitter into an amplitude signal for an amplitude branch and a phase-modulated radio frequency (RF) signal for an RF branch;
  compensating, at the AM transmitter, for non-linear distortions in an amplitude response and a delay-time characteristic of the RF branch using a pre-equalization with inverse shapes by:
    measuring and storing the amplitude response and the delay-time characteristic;
    determining an inverse transfer function using respective inverse shapes of the measured amplitude response and delay-time characteristic by an inverse Fourier transform;
    determining an impulse response to the measured shapes of amplitude and phase by the inverse Fourier transform so as to yield a coefficient for a filter for the pre-equalization, the filter comprising a finite impulse response structure;
    dimensioning, in an equalizing network, the determined inverse transfer function; determining a shape of a phase by integration over a measured shape of the propagation time;
    connecting the equalizing network in a series connection, the series connection being upstream of the RF branch; and
  combining, at the AM transmitter, the amplitude branch and the RF branch downstream of the amplitude and RF branches.

* * * * *